(12) United States Patent
Nishimura

(10) Patent No.: US 7,321,246 B2
(45) Date of Patent: Jan. 22, 2008

(54) DRIVER CIRCUIT FOR A LIQUID CRYSTAL DISPLAY

(75) Inventor: Kouichi Nishimura, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/406,431

(22) Filed: Apr. 19, 2006

(65) Prior Publication Data

US 2006/0186934 A1   Aug. 24, 2006

Related U.S. Application Data

(62) Division of application No. 10/942,905, filed on Sep. 17, 2004, now Pat. No. 7,075,342.

(30) Foreign Application Priority Data

Sep. 22, 2003   (JP) .............................. 2003-330294

(51) Int. Cl.
   *H03K 3/00* (2006.01)
(52) U.S. Cl. ......................................... 327/112; 345/98
(58) Field of Classification Search ................ 327/112;
                                330/265, 270, 271; 345/98, 100
See application file for complete search history.

(56) References Cited

U.S. PATENT DOCUMENTS 4,644,288 A   2/1987   Stanley

| 5,006,739 A * | 4/1991 | Kimura et al. ............... 327/112 |
| 5,459,416 A | 10/1995 | Ghia et al. |
| 5,515,024 A | 5/1996 | Ghia et al. |
| 5,528,541 A | 6/1996 | Ghia et al. |
| 5,783,970 A * | 7/1998 | Pleitz .......................... 330/269 |
| 5,818,295 A * | 10/1998 | Chimura et al. ............. 327/561 |
| 5,841,317 A * | 11/1998 | Ohmori et al. .............. 327/563 |
| 6,163,217 A * | 12/2000 | Matsubara et al. ......... 330/255 |
| 6,624,669 B1 | 9/2003 | Tsuchi |
| 6,661,259 B2 | 12/2003 | Tsuchi |
| 6,717,470 B1 * | 4/2004 | Bowers ....................... 330/255 |

FOREIGN PATENT DOCUMENTS

| CN | 1138741 A | 1/1997 |
| CN | 1396579 A | 2/2003 |
| JP | 2000-338461 A | 12/2000 |
| JP | 2003-022055 A | 1/2003 |

* cited by examiner

*Primary Examiner*—Kenneth B. Wells
(74) *Attorney, Agent, or Firm*—Foley & Lardner LLP

(57) ABSTRACT

A driver circuit includes a differential amplifier for receiving an input signal, and first and second transistors of different conductivity types. The first and second transistors are connected serially between two power supply terminals in a form (source follower) in which the sources of the transistors are connected to an output point, for push-pull driving the output point in response to an output signal from the differential amplifier.

11 Claims, 16 Drawing Sheets

DRIVER CIRCUIT FOR A LIQUID CRYSTAL DISPLAY

CROSS-REFERENCE TO RELATED PATENT APPLICATIONS

This application is a division of application Ser. No. 10/942,905, filed Sep. 17, 2004, now U.S. Pat. No. 7,075,342, and based on Japanese Patent Application No. 2003-330294, filed Sep. 22, 2003, by Kouichi Nishimura. This application claims only subject matter disclosed in the parent application and therefore presents no new matter.

FIELD OF THE INVENTION

This invention relates to a driver circuit and, more particularly, to a driver circuit capable of being used in ideal fashion as an amplifier circuit for driving a capacitive load such as a liquid crystal display panel.

BACKGROUND OF THE INVENTION

Liquid crystal displays, or LCDs, which employ thin-film transistors, or TFTS, as switching elements are becoming ever larger in size. Specifically, LCDs having a 20-inch screen size or larger have started being used in televisions and are about to replace conventional CRTs (Cathode-Ray Tubes). However, since this increase in screen size is accompanied by increased load on the data lines of the TFTs, a problem which arises is that data cannot be written to the extreme ends of the data lines in one horizontal synchronization interval. To deal with this problem, the conventional measure is to dispose source drivers (horizontal drivers) on both the upper and lower sides of the liquid crystal panel and drive these simultaneously (this is referred to as "two-sided drive"). With two-sided drive, however, two horizontal drivers are necessary and hence there is large increase in cost. Accordingly, various improvements have been made heretofore in order to enable the writing of data reliably to the extreme ends of drain lines while preserving "single-sided drive," in which only the upper or lower side of the liquid crystal panel is provided with a source driver. One examples of such an improvement is illustrated in FIGS. 9 to 14.

CONVENTIONAL EXAMPLE 1

FIG. 9 schematically illustrates the structure of a conventional liquid crystal display 100 that employs single-sided drive. As shown in FIG. 9, the liquid crystal display 100 is one that applies an analog data signal, which is produced from digital video data, to a liquid crystal panel. The liquid crystal display 100 includes a color liquid crystal panel 101, a control circuit 102, a grayscale-level power supply 103, a data-electrode driver circuit (source driver) 104 and a scanning-electrode driver circuit (gate driver) 105.

The color liquid crystal panel 101 is of the active-matrix drive type that employs TFTs as switching elements. The color liquid crystal panel 101 has n-number (where n represents a natural number of 2 or greater) of scanning electrodes (gate lines) 106-1 to 106-n provided along the row direction at prescribed intervals, and m-number (where m represents a natural number of 2 or greater) of data electrodes (source lines) 107-1 to 107-n provided along the column direction at prescribed intervals. The areas in the vicinity of the points at which the scanning electrodes 106-1 to 106-n and data electrodes 107-1 to 107-n are intersected are referred to as "pixels." The total number of pixels constituting the display screen is n×m. Disposed on the color liquid crystal panel 101 for each and every pixel are a liquid crystal capacitor 108, which is a capacitive load, a common electrode 109, a TFT 110 for driving the corresponding liquid crystal capacitor 108, and an auxiliary capacitor (not shown) for accumulating a data charge over one vertical synchronization interval. When the device is driven, red, green and blue analog data signals, which are generated based upon red, green and blue data, respectively, in digital video data, are applied to the data electrodes 107-1 to 107-m, and gate pulses (scanning signals), which are generated based upon horizontal and vertical scanning signals, are applied to the scanning electrodes 106-1 to 106-n, this taking place in a state in which a common potential Vcom is impressed upon the common electrode 109. As a result, text and images are displayed in color on the display screen of the color liquid crystal panel 101.

The control circuit 102 is constituted by, e.g., an ASIC (Application Specific Integrated Circuit). On the basis of an externally supplied clock, the horizontal and vertical synchronizing signals and a data enable signal, etc., the control circuit 102 generates a strobe signal, a dot clock, horizontal scanning pulses, a polarity signal and vertical scanning pulses and supplies these signals to the source driver 104 and gate driver 105. The strobe signal is a signal having the same period as that of the horizontal synchronizing signal. The dot clock has a frequency the same as or different from that of the clock and, as will be described later, is used in order to generate sampling pulses from the horizontal scanning pulses in a shift register that constructs the source driver 104. The horizontal scanning pulses have a period the same as that the horizontal synchronizing signal but lag behind the strobe signal by several pulses of the clock. The polarity signal is a signal whose polarity reverses every horizontal synchronization period (i.e., line by line) and is used to subject the color liquid crystal panel 101 to AC drive. The polarity of the polarity signal also reverses every vertical synchronization period. The vertical scanning pulses have the same period as that of the vertical synchronizing signal.

The grayscale-level power supply 103 comprises a plurality of resistors cascade-connected between a reference voltage line and a ground line, and a plurality of voltage followers having their input ends connected to the nodes of the adjacent resistors. The grayscale-level power supply 103 supplies the source driver 104 with grayscale-level voltages upon amplifying and buffering the grayscale-level voltages, which are set for the purpose of a gamma correction that appears at the nodes of adjacent resistors. Accordingly, in order to obtain a reproduced image of excellent tonality with the gamma of the overall system being made unity, it is necessary to correct the analog video signal or digital video data. This is referred to as a "gamma correction." In general, a gamma correction is applied to an analog video signal or to digital video data in order to make the signal or data conform to the characteristic (gamma characteristic) of a CRT display, i.e., in order to achieve compatibility with respect to this characteristic. FIG. 10 illustrates an example of the relationship (namely a gamma correction characteristic) between 6-bit input data (expressed in hexadecimal form) and grayscale-level voltages of V0 to V4 and V5 to V9.

As shown in FIG. 9, the source driver 104 essentially comprises a video data processing circuit 111, a digital/analog converter (DAC) 112 and m-number of output circuits 113-1 to 113-m. Though not shown, the video data processing circuit 111 generally includes a shift register, a data register, a latch and a level shifter. The shift register is a serial-in/parallel-out shift register consisting of a plurality of delay flip-flops. In sync with the dot clock supplied from the control circuit 102, the shift register performs a shift operation for shifting the horizontal scanning pulses supplied from the same control circuit 102 and outputs parallel sampling pulses of a plurality of bits. In sync with the sampling pulses supplied from the shift register, the data register loads the red, green and blue data of the externally supplied digital video data as display data and supplies this data to a latch. In sync with the rising edge of the strobe signal supplied from the control circuit 102, the latch loads the display data supplied from the data register and holds the loaded display data until the next strobe signal is supplied, i.e., for the duration of one horizontal synchronization interval. The level shifter converts the voltage of the output data from the latch and outputs the resulting signal as voltage-converted display data.

The D/A converter 112 subjects the voltage-converted display data supplied from the video data processing circuit 111 to the above-described gamma correction based upon the set of grayscale-level voltages V0 to V4 or V5 to V9 supplied from the grayscale-level power supply 103, thereby affording tonality. The D/A converter 112 converts the gamma-corrected red, green and blue data to analog-data red, green and blue signals and supplies these signals to the corresponding output circuits 113-1 to 113-m.

Since the output circuits 113-1 to 113-m are identically constructed, the structure of output circuit 113-1 only is illustrated in FIG. 11. As will be evident from FIG. 11, the output circuit 113-1 comprises voltage followers 114a, 114b and switches 115a, 115b.

As shown in FIG. 12, the voltage follower 114a comprises a class-A amplifier having N-channel MOS transistors MN11 and MN12, P-channel MOS transistors MP11, MP12 and MP13, constant-current sources CI11 and CI12 and a capacitor C11. The voltage follower 114a amplifies, buffers and outputs a data signal of positive polarity supplied from the D/A converter 112. As shown in FIG. 13, the voltage follower 114b comprises a class-A amplifier having P-channel MOS transistors MP14 and MP15, N-channel MOS transistors MN13, MN14 and MN15, constant-current sources CI13 and CI14 and a capacitor C12. The voltage follower 114b amplifies, buffers and outputs a data signal of negative polarity supplied from the D/A converter 112.

When a polarity signal POL supplied from the control circuit 102 attains the "H" level, the switch 115a turns ON, thereby applying a data signal S of positive polarity, which is supplied from the voltage follower 114a, to the corresponding data electrode 107-1 of the color liquid crystal panel 101. When a polarity signal POL supplied from the control circuit 102 attains the "L" level, the switch 115a turns ON, thereby applying a data signal S of negative polarity, which is supplied from the voltage follower 114b, to the corresponding data electrode 107-1 of the color liquid crystal panel 101.

The gate driver 105 generates gate pulses successively in sync with the timing of the vertical scanning pulses supplied from the control circuit 102 and applies the gate pulses successively to the corresponding scanning electrodes 106-1 to 106-n of the color liquid crystal panel 101, thereby scanning the scanning electrodes 106-1 to 106-n once in one vertical synchronization interval.

Next, the operation of the conventional liquid crystal display 100 having the structure set forth above will be described with reference to a timing chart shown in FIG. 14.

In FIG. 14, reference characters TF and TH represent the duration of one frame and one horizontal scanning interval, respectively. Here a "dot inversion driving method" will be employed as the method of driving the color liquid crystal panel 101. According to the dot inversion driving method, the polarity of the data signals applied to the data electrodes 107-1 to 107-m is controlled in such a manner that the potential (polarity) to be applied to the display electrodes will be reversed dot by dot using the common potential Vcom, which is impressed upon the common electrode 109, as a reference. In general, when voltage of the same polarity is impressed continuously upon the liquid crystal cell of the color liquid crystal panel 101, a phenomenon referred to as "burn-in" occurs in which traces of characters and the like remain on the screen even when the power supply is turned off. The dot inversion driving method has long been employed in order to prevent such burn-in. Even if the polarity of the voltage applied to the liquid crystal cell of the color liquid crystal panel 101 is reversed, there is almost no change in the transmittance characteristic of the liquid crystal cell. In general, therefore, a grayscale-level voltage having the same voltage value is employed in the case of positive polarity and in the case of negative polarity.

A clock VCK indicated at (1) in FIG. 14 is the clock used by the gate driver 105. In sync with pulses P1, P2, . . . , Pn of the clock VCK, gate pulses (scanning voltage pulses) VG1, VG2, . . . VGn are generated successively one line at a time, as indicated at (2), (3) and (4) in FIG. 14, and applied successively to the corresponding scanning electrodes 106-1 to 106-n of the color liquid crystal panel 101. As indicated at (5) and (6) in FIG. 14, the source driver 104 outputs the data signals of red, green and blue from each of the output circuits 113-1 to 113-n several microseconds after generation of the gate pulses VG1, VG2, . . . , Vgn. In FIG. 14, (5) indicates the voltage waveform of the data signal that is output from even-numbered output circuits counting from the left in FIG. 9, and (6) indicates the voltage waveform of the data signal that is output from odd-numbered output circuits counting from the left in FIG. 9.

CONVENTIONAL EXAMPLE 2

A circuit arrangement shown in FIG. 15 can also be used instead of the circuit arrangement of FIGS. 12 and 13 for the voltage followers 114a and 114b illustrated in FIG. 11. FIG. 15 is essentially equivalent to a circuit arrangement disclosed in the specification of Japanese Patent Kokai Publication No. JP-P2000-338461A.

The circuit of FIG. 15 comprises a PMOS source-follower output circuit 116a, an NMOS source-follower output circuit 116b, an precharging circuit 117 and switches S21, S22. The PMOS source-follower output circuit 116a comprises P-channel MOS transistors (PMOS transistor) MP26, MP27, and constant-current sources CI21, CI22, CI23. The NMOS source-follower output circuit 116b comprises N-channel MOS transistors (NMOS transistor) MN26, MN27 and constant-current sources CI24, CI25, CI26. The precharging circuit 117 comprises switches S23, S24 for precharging drive. The switches S21 and S22 are used to switch between the PMOS source-follower output circuit 116a and the NMOS source-follower output circuit 116b.

Next, the operation of the voltage follower shown in FIG. 15 will be described with reference to FIG. 16. In FIG. 16, (A) indicates the output waveform over the period of positive polarity. This is the output waveform that prevails when the PMOS source-follower output circuit 116a is being used owing to switching by the switches S21 and S22. Further, (B) in FIG. 16 indicates the output waveform over the period of negative polarity. This is the output waveform that prevails when the NMOS source-follower output circuit 116b is being used owing to switching by the switches S21 and S22.

In general, a source-follower circuit has only a unidirectional drive function. For example, in the PMOS source-follower output circuit 116a, the source-follower circuit constituted by the PMOS transistor MP27 has sufficient ability to draw in current but does not have the ability to expel current; it only has the ability to expel the current ascribable to the constant-current source CI23 connected to the PMOS transistor MP27. Ordinarily, the current value of the constant-current source CI23 is set to be extremely small and therefore the current expelling drive capability is very small. Similarly, in the NMOS source-follower output circuit 116b, the source-follower circuit constituted by the NMOS transistor MN27 has sufficient ability to expel in current but does not have the ability to draw current; it only has the ability to draw the current ascribable to the constant-current source CI26 connected to the NMOS transistor MN27. For these reasons, the voltage follower shown in FIG. 15 is such that precharging is performed using the initial part of one horizontal scanning interval, as shown in FIG. 16. In the remaining part of this interval, the voltage follower operates such that the potential returns to the desired potential owing to the capability of the source-follower output circuit 116a or 116b.

If precharging is not carried out, the load will be driven by a constant current of small value and therefore the rise characteristic is degraded severely in case of the source-follower circuit 116a and the decay characteristic in case of the source-follower circuit 116b. Here this problem is avoided by combining the source-follower circuits 116a, 116b and the precharging circuit 117.

CONVENTIONAL EXAMPLE 3

An advance over the circuit of FIG. 15 is disclosed in the specifications of Japanese Patent Kokai Publication Nos. JP-P2000-338461A and JP-P2003-22055A (not shown). These specifications basically connect a transistor of one conductivity type between one power supply line and an output terminal in source-follower form, connect a transistor of another conductivity type between another power supply line and the same output terminal in source-follower form, and provide both transistors with switches. Either one of the source-follower circuits is activated depending upon the polarity of the input signal.

SUMMARY OF THE DISCLOSURE

Conventional Example 1 illustrated in FIGS. 9 to 14 has the following problem:

Usually there is a difference in offset voltage between the voltage follower 114a of FIG. 12 operated at the time of positive polarity and the voltage follower 114b of FIG. 13 operated at the time of negative polarity and therefore a so-called output deviation occurs, giving rise to a decline in image quality such as vertical streaks.

With Conventional Example 2 shown in FIGS. 15 and 16, a problem which arises is that the PMOS source-follower output circuit 116a and NMOS source-follower output circuit 116b are used switchingly in dependence upon the polarity of the input signal, as a consequence of which there is a decline in image quality owing to the above-mentioned output deviation in a manner similar to that of Example 1.

Further, as mentioned above, if precharging is not carried out, the load is driven by a constant current of small value. Consequently, the rise or fall characteristic worsens markedly. With Example 2, therefore, a problem which arises is that regardless of the output level, the device will not operate normally unless the precharging operation is performed.

With the driver circuit of Conventional Example 3 as well, the current driving capability is very small and the device will not operate normally unless precharging is carried out. Moreover, since two source followers are operated selectively using switching, an output deviation ascribable to offset voltage occurs and image quality declines.

Accordingly, an object of the present invention is to provide a driver circuit the driving capability of which is improved while output deviation is reduced.

According to a first aspect of the present invention, the foregoing object is attained by providing a driver circuit comprising an amplifier circuit for receiving an input signal; and first and second transistors of mutually different conductivity types, which are connected serially between two power supply terminals in a form in which sources of the transistors are connected to an output point, for push-pull driving the output point in response to an output signal from the amplifier circuit; a signal at the output point being fed back to the amplifier circuit.

According to the driver circuit of present invention, the output side of an amplifier circuit has first and second transistors of mutually different conductivity types, which are connected serially between two power supply terminals in a form in which the sources of the transistors are connected to an output point, for push-pull driving the output point in response to an output signal from the amplifier circuit. As a result, on the output side of the amplifier circuit, the first transistor of one conductivity type has a source-follower arrangement and the second transistor of the other conductivity type likewise has a source-follower arrangement. The first and second transistors drive the output point in push-pull fashion in response to the output signal of the amplifier circuit. As a result, the output deviation caused by the offset voltage can be reduced. In addition, the danger that image quality will decline owing to an output deviation is mitigated.

Furthermore, since the output signal at the output point is fed back to the amplifier circuit, the driving capability possessed by the first and second transistors can be utilized effectively. This makes it possible to increase driving capability.

In a preferred embodiment of the driver circuit according to the present invention, the first and second transistors are driven in push-pull fashion based upon class-B operation. Since class-B operation is carried out in this example, an advantage is that power consumption can be reduced.

In another preferred embodiment of the driver circuit according to the present invention, the driver circuit further comprises a first switch provided in parallel with the first transistor between one of the two power supply terminals and the output point; and a second switch provided in parallel with the second transistor between the other of the two power supply terminals and the output point. In this example, the first or second switch is turned ON selectively, whereby precharging is applied to the output point, in a range in which the first and second transistors cannot perform a source-follower operation. As a result, the range over which a high driving capability is obtained can be enlarged and it is possible to achieve high-speed operation.

In this example, it is preferred that a third switch be provided in a path that connects an output terminal of the driver circuit and the output point, the third switch being controlled so as to open the path when precharging of the output point is performed and close the path when precharging is not performed. This example is advantageous in that when precharging is carried out, the output point is cut off from the output terminal of the driver circuit by the third switch, as a result of which it is possible to prevent precharging from affecting the output point.

In another preferred embodiment of the driver circuit according to the present invention, the driver circuit further comprises a determination circuit for investigating the input signal and determining whether or not precharging is necessary. This example is advantageous in that precharging can be carried out reliably when necessary. The determination circuit preferably is adapted so as to discriminate n-number (where n is a positive integer) of higher order bits of the input signal to thereby determine whether precharging is necessary. For example, if the determination circuit judges that the input signal is a prescribed grayscale level, then the circuit determines that precharging is necessary.

In another preferred embodiment of the driver circuit according to the present invention, a third switch and a first constant-current source connected serially to each other are provided in parallel with the first transistor between one of the two power supply terminals and the output point, and a fourth switch and a second constant-current source connected serially to each other are provided in parallel with the second transistor between the other of the two power supply terminals and the output point. The third switch is controlled so as to be turned ON and OFF substantially in sync with ON and OFF operation of the first transistor, and the fourth switch is controlled so as to be turned ON and OFF substantially in sync with ON and OFF operation of the second transistor. This example is advantageous in that output dynamic range can be broadened greatly and driving capability improved greatly. In this example, it is preferred that the third switch and first constant-current source as well as the fourth switch and the second constant-current source be used to pass an output idling current. Doing so affords the advantage of enabling the gate potential of the first and second transistors to be stabilized when class-B push-pull operation is performed and the output current become nil.

The meritorious effects of the present invention are summarized as follows.

Thus, in accordance with the driver circuit of present invention, it is possible to improve driving capability while reducing output deviation.

Other features and advantages of the present invention will be apparent from the following description taken in conjunction with the accompanying drawings, in which like reference characters designate the same or similar parts throughout the figures thereof.

PREFERRED EMBODIMENTS OF THE INVENTION

A preferred embodiment of a driver circuit according to the present invention will be described in detail with reference to the accompanying drawings. In this embodiment, the present invention is applied to an amplifier circuit for driving an LCD.

Figure 1:
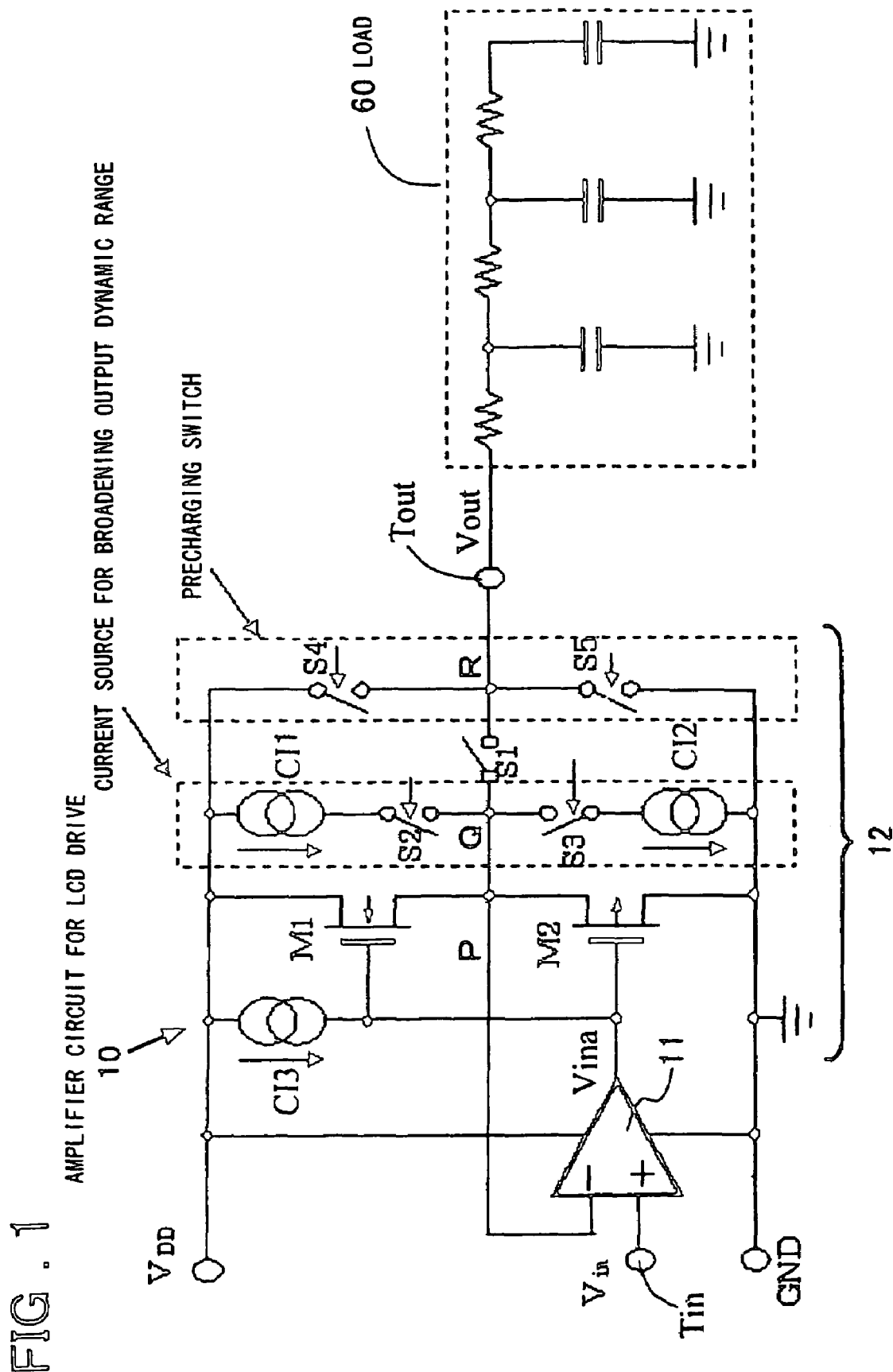
FIG. 1 is a circuit diagram illustrating the structure of an amplifier circuit, which is for driving an LCD, used in an LCD driver circuit according to a first embodiment of the present invention.
Figure 2:
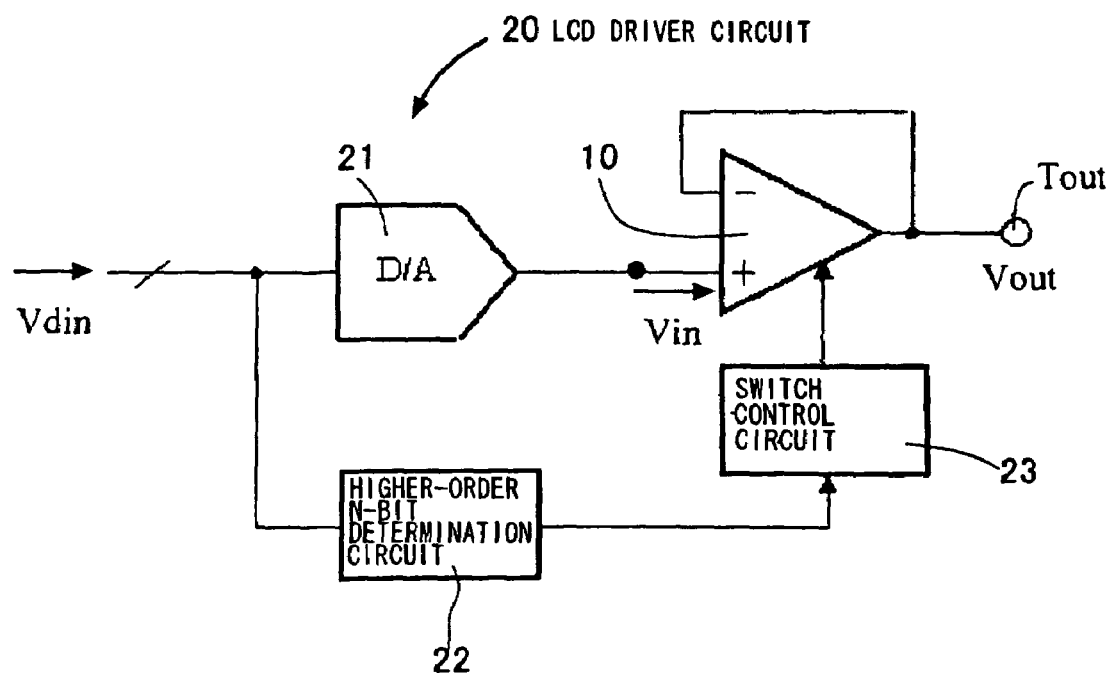
FIG. 2 is a functional block illustrating the structure of the LCD driver circuit according to the first embodiment.

FIG. 1 is a circuit diagram illustrating the structure of an amplifier circuit 10 for driving an LCD in an embodiment of the present invention, and FIG. 2, is a functional block diagram illustrating the structure of an LCD driver circuit 20 constructed using the amplifier circuit 10 for LCD drive.

As shown in FIG. 1, the amplifier circuit 10 for LCD drive according to this embodiment includes a differential amplifier 11, an output section 12, an input terminal Tin and an output terminal Tout. A load (the liquid crystal capacitance of a liquid crystal panel) 60 is connected to the output terminal Tout.

The differential amplifier 11 is constituted by an operational amplifier, receives an analog input signal voltage Vin, which is applied thereto from the input terminal Tin, at a non-inverting (+ side) input terminal, receives the fed-back output voltage Vout at an inverting (− side) input terminal, differentially amplifies both signal voltages and outputs the amplified signal, namely an output signal Vina. The latter is supplied to the output section 12. Since the structure and operation of the differential amplifier 11 are well known and have no direct bearing upon the present invention, a detailed description thereof is omitted.

The output section 12 has a source-follower N-channel MOS transistor M1, a source-follower P-channel MOS transistor M2 and a constant-current source CI3. The gates of both transistors M1 and M2 are tied together and connected to the output terminal of the differential amplifier 11. The sources of both transistors M1 and M2 are tied together and connected to a node (output point) P. The output point P is connected to the inverting input terminal of the differential amplifier 11 and therefore the signal (Vout) at the output point P is fed back to the inverting input terminal of the differential amplifier 11. The drain of transistor M1 is connected to a power supply line (power supply terminal) to which a supply voltage $V_{DD}$ is applied, and the drain of transistor M2 is connected to a ground line (ground terminal) held at ground potential GND. The constant-current source CI3 is connected between the power supply line and the gates of transistors M1 and M2. The constant-current source CI3 is a current source for controlling the output current of the differential amplifier 11.

It goes without saying that another power supply line (power supply terminal) to which a supply voltage $V_{SS}$ is applied may be used instead of the ground line (ground terminal) held at ground potential GND.

Thus, in the circuit arrangement of FIG. 1, the two transistors M1, M2 of different conductivity types are in a source-follower configuration in which each transistors performs a class-B operation, and the transistors M1, M2 are connected in series between the power supply line and the ground line. The output of the differential amplifier 11 is applied commonly to the gates of transistors M1, M2, and the output of the source-follower circuit block is extracted from the source (output point P) of the transistors M1 and M2. In other words, the two transistors M1, M2 of different conductivity types are connected serially between two power supply terminals (i.e., between the power supply line and ground line) as source followers, and the commonly connected sources (the output point P) of the two transistors M1, M2 are driven in class-B push-pull fashion. Accordingly, the source-follower block performs class-B push-pull amplification and forms a complementary-type output. As a result, a sufficient ability to draw in and expel current is obtained. Owing to the source-follower configuration, the output impedance is comparatively low and feedback is applied. This means that the output impedance declines further and an excellent characteristic is obtained for this type of amplifier (buffer).

The output section 12 has two constant-current sources CI1 and CI2, and five switches S1, S2, S3, S4 and S5. The switch S1 is provided between a node Q and a node R and opens and closes the path between the node P (the output point of the source-follower circuit block) and the output terminal Tout. The constant-current source CI1, which is of the current-expelling type, has one end connected to the power supply line and its other end connected to one end of the switch S2. The other end of the switch S2 is connected to node Q. Accordingly, the current resulting from constant-current source CI1 is supplied to node Q only when switch S2 is turned ON. The constant-current source CI2, on the other hand, is of the draw-in type and has its end connected to the ground line and its other end connected to one end of the switch S3. The other end of the switch S3 is connected to node Q. Accordingly, current is drawn into the constant-current source CI2 from node Q only when switch S3 is turned ON. The constant-current sources CI1 and CI2 and the switches S3 and S4 act to broaden the output dynamic range of the amplifier circuit 10 for driving the LCD.

The switch S4 is connected between the power supply line and a node R, and the switch S5 is connected between the ground line and the node R. Both switches S4 and S5 are for precharging control and are turned ON when necessary to thereby perform precharging (overdrive) of the output terminal Tout.

The output terminal Tout is connected to the inverting input terminal of the differential amplifier 11 via node R, switch S1, node Q and node (output point) P. The output signal voltage Vout (the signal voltage at output point P) is fed back to the input side of the amplifier circuit 10 for LDC drive.

FIG. 2 illustrates the structure of the LCD driver circuit 20 according to this embodiment that employs the amplifier circuit 10 having the structure set forth above.

As will be apparent from FIG. 2, the input side of the LCD driving amplifier circuit 10 of FIG. 1 is provided with a D/A converter 21 for converting a digital input voltage signal Vdin to an analog signal and generating the analog input signal voltage Vin. Also provided are a higher-order n-bit determination circuit 22 and a switch control circuit 23 in order to control the switching of switches S1 to S5.

Figure 4:
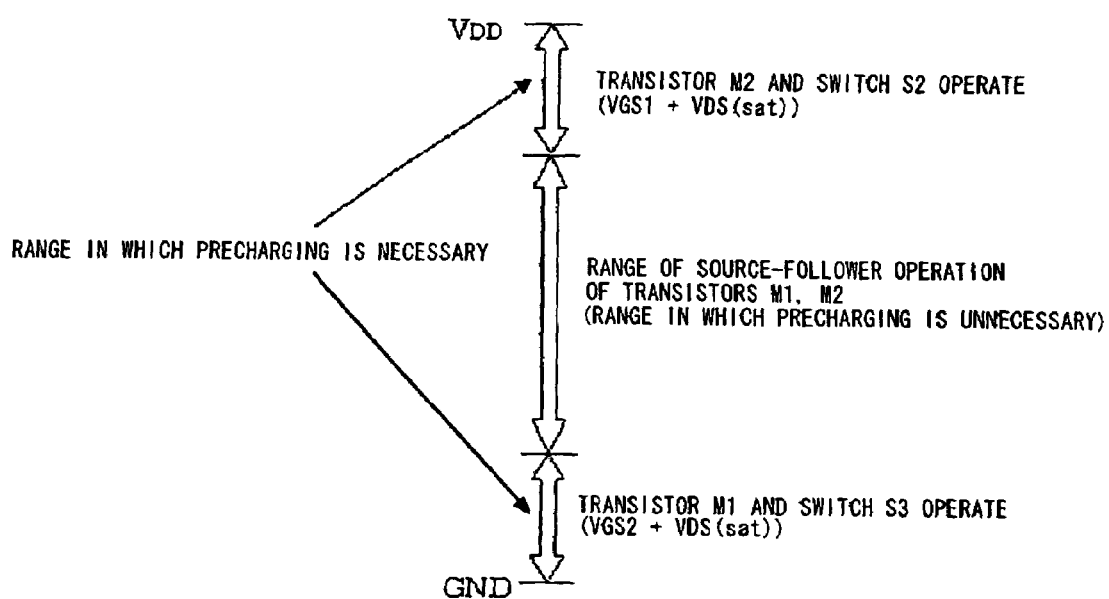
FIG. 4 is an explanatory view illustrating demarcations of the operating range of the LCD driver circuit according to the first embodiment.

The higher-order n-bit determination circuit 22 examines n-number of higher bits of the digital input voltage signal Vdin, determines whether precharging (overdrive) is necessary and sends the switch control circuit 23 a signal conforming to the result of this determination. For example, if the determination circuit 22 examines the three higher order bits of the digital input signal Vdin, the circuit can determine whether the signal lies within a range, which is shown in FIG. 4, necessary for precharging (overdrive). For example, it can be so arranged that precharging is carried out only when the grayscale-level output ranges from 0 to 1 V or $(V_{DD}-1)$ to $V_{DD}$ V, and the usual operation devoid of precharging is carried at all other times.

Figure 5:
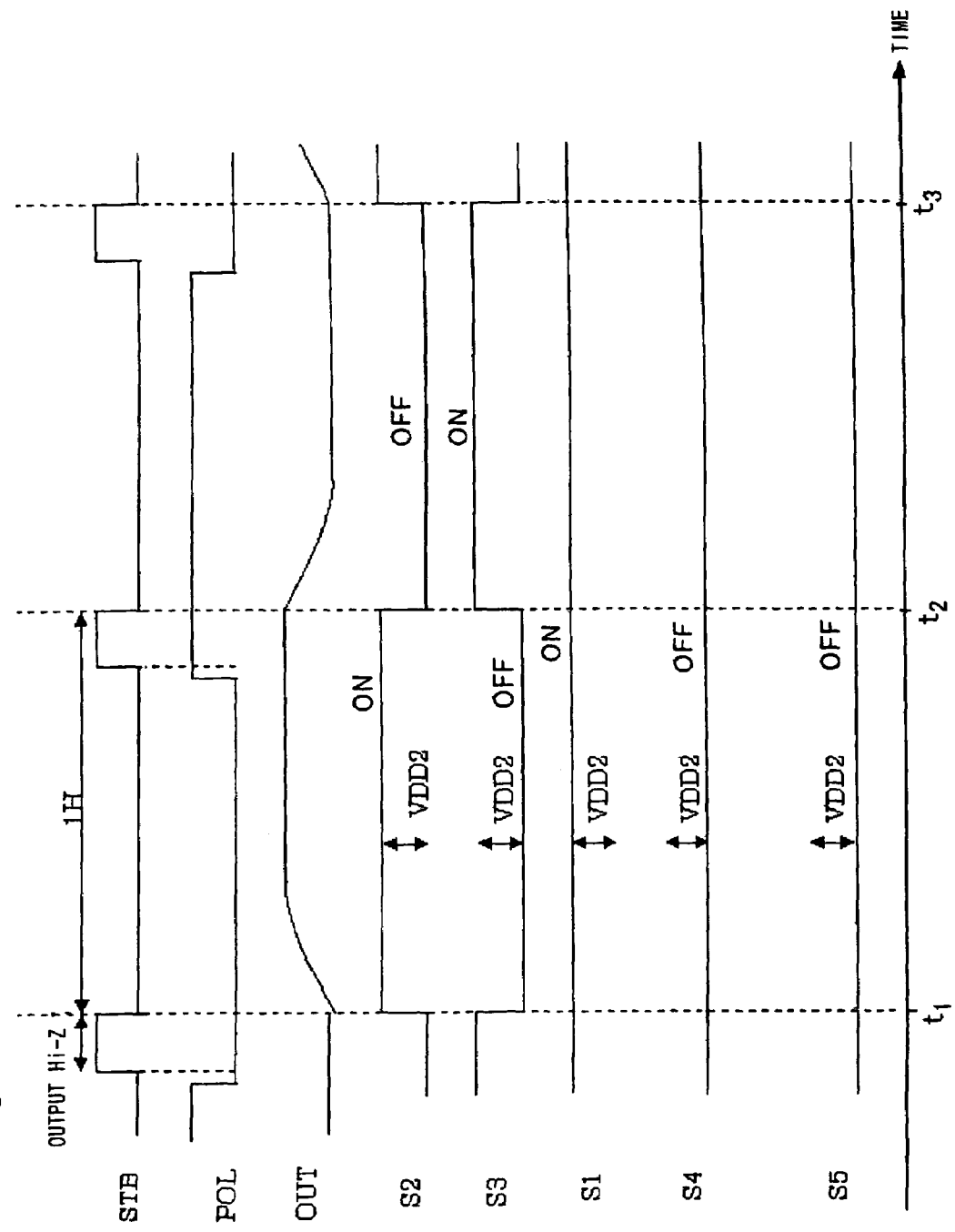
FIG. 5 is a timing chart illustrating operation in a case where precharging in the LCD driver circuit according to the first embodiment is not carried out.
Figure 6:
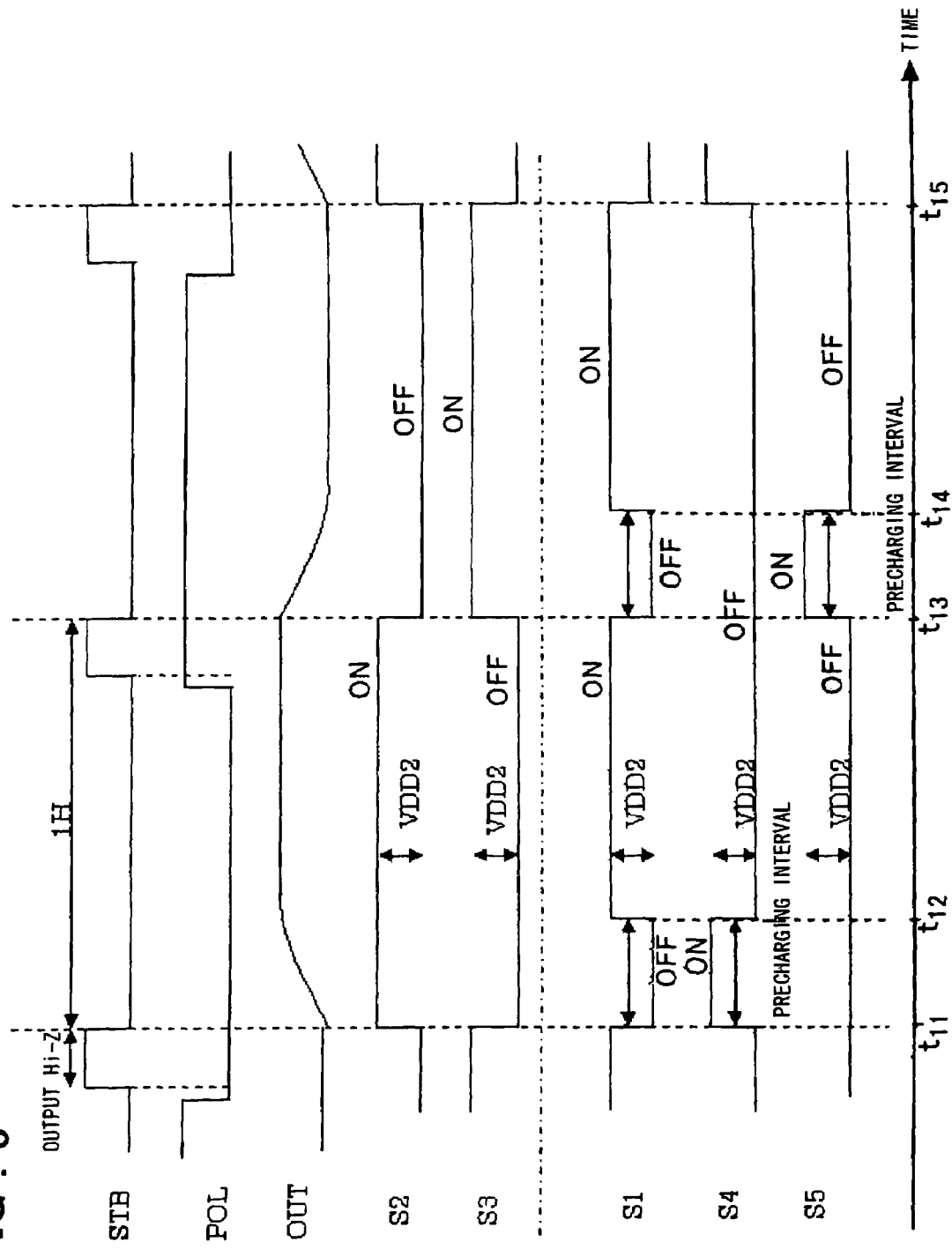
FIG. 6 is a timing chart illustrating operation in a case where precharging in the LCD driver circuit according to the first embodiment is carried out.

The switch control circuit 23 controls the switching of the switches S1 to S5 so as to obtain the waveforms shown in FIGS. 5 and 6 in accordance with the content of the determination result sent from the higher-order n-bit determination circuit 22.

As will be understood from the description rendered above, the LCD driving amplifier circuit 10 shown in FIG. 1 has the differential amplifier 11 for receiving the input signal voltage Vin, and the transistors M1, M2 of mutually different conductivity types, which are connected serially between the two power supply terminals VDD and GND in a form in which the sources of the transistors are connected to the output point P, for push-pull driving the output point P in response to the output signal Vin from the differential amplifier 11. The signal at the output point P is fed back to the differential amplifier 11. On the output side of the amplifier circuit 11, therefore, the transistor M1 of one conductivity type has a source-follower arrangement and the transistor M2 of the other conductivity type likewise has a source-follower arrangement. The transistors M1 and M2 drive the output point P in push-pull fashion in response to the output signal Vina of the differential amplifier 11. As a result, the output deviation caused by the offset voltage can be reduced. In addition, the danger that image quality will decline owing to an output deviation is mitigated.

Furthermore, since the output signal at the output point P is fed back to the differential amplifier 11, the driving capability possessed by the two transistors M1 and M2 can be utilized effectively. This makes it possible to increase the driving capability of the LCD driving amplifier circuit 10.

Preferably, the transistors M1 and M2 undergo push-pull drive based upon class-B operation. The reason for this is the advantage of a reduction in power consumption when class-B operation is carried out. However, the present invention can be worked even if this is not the case.

The switches S4 and S5 are switches for precharging purposes and are turned ON in a case where it has been determined that precharging is required with regard to the output terminal Tout. These switches are turned OFF if it has been determined that precharging is unnecessary. The switches S4 and S5 are not necessarily required to work the present invention. However, since precharging is necessary in actual use, providing both of the switches S4 and S5 would be considered usual, as in this embodiment. The switches S4 and S5 are turned ON selectively in a range in which the transistors M1 and M2 do not perform the source-follower operation, whereby precharging is carried out with regard to the output point P (i.e., the output terminal Tout). As a result, the range over which a high driving capability is obtained can be enlarged and operation can be speeded up.

Since the switches S2, S3 and constant-current sources CI1, CI2 are for broadening the output dynamic range, they are not necessarily required to work the present invention. In actual use, however, it is desirable that the output dynamic range be as broad as possible and therefore these switches and current sources preferably are provided as in the illustrated embodiment.

The switch S1 is provided in the path connecting the output terminal Tout of the LCD driving amplifier circuit 10 and the output point P, and control is exercised so as to open this path when precharging is carried out with regard to the output point P and close the path when precharging is not carried out. Switch S1 is not necessarily required to work the present invention, though providing the switch is preferred, as in the illustrated embodiment. The reason for this is that since the output point P is severed from the output terminal Tout of the amplifier circuit 10 by the switch S1 when precharging is performed, precharging can be prevented from influencing the output point P.

Next, the operation of the LCD driving amplifier circuit 10 having the structure shown in FIG. 1 and the operation of the LCD driver circuit 20 having the structure shown in FIG. 2 will be described.

In the LCD driving amplifier circuit 10, two source-follower circuits comprising the transistors M1 and M2 reside in the feedback loop and therefore operation is such that the voltage at the output point P is always equal to the input voltage Vin. As a result, the amplified output voltage Vina of the differential amplifier 11 that amplifies the input signal voltage Vin is Vin+VGS1 or Vin−VGS2. It should be noted that VGS1 is the gate-source voltage of transistor M1 and VGS2 is the gate-source voltage of transistor M2. In other words, the inverting input terminal (i.e., the output point P) of the amplifier circuit 10 and the input terminal Tin are in an imaginary shorted relationship and therefore the amplifier circuit 10 operates in such a manner that the voltage at the output point P becomes equal to the input voltage Vin at all times.

In AC drive of the liquid-crystal capacitance 60 of the liquid crystal panel serving as the load, the transistor M1 turns OFF (attains the cut-off state) and the transistor M2 turns ON (attains the active state) over the interval during which the polarity of the input signal voltage Vin is positive, and therefore the potential at the output point P becomes equal to the input voltage Vin. As a result, the amplified output voltage Vina of the differential amplifier 11 becomes Vin−VGS2. Operation is the reverse of the above over the interval during which the polarity of the input signal voltage Vin is negative. That is, the transistor M1 turns ON (attains the active state) and the transistor M2 turns OFF (attains the cut-off state) and therefore the potential at the output point P becomes equal to the input voltage Vin. As a result, the amplified output voltage Vina of the differential amplifier 11 becomes Vin+VGS1. The source-follower circuit block (transistors M1, M2 and constant-current source CI3) of the LCD driving amplifier circuit 10 thus performs a source-follower operation in push-pull fashion.

If the amplified output voltage Vina is within a range in which the source-follower circuit block inclusive of transistors M1 and M2 can be driven, then class-B push-pull amplification is performed in the manner described above. Consequently, a high driving capability is obtained at a low output impedance.

Specifically, the range over which the source-follower circuit block can be driven is as follows:

$$V_{DD}-[V_{GS1}+V_{DS(sat)}] \text{ to } V_{GS2}+V_{DS(sat)}$$

where $V_{DS(sat)}$ is the boundary voltage of a triode region and pentode region of transistors constructing the preceding stage or constant-current source CI3.

The source-follower circuit block cannot perform the source-follower operation outside the above-mentioned range and therefore driving of the load 60 is made possible by precharging the output terminal Tout. More specifically, in a range close to the supply voltage $V_{DD}$, the potential at the output section 12 of the amplifier circuit 10, namely at the output point P, is temporarily pulled up to the supply voltage $V_{DD}$ by precharging, thereby making it possible for the P-channel transistor M2 to operate. Since the transistor M2 has no ability to expel current but does have the ability to draw in current, this becomes possible. Operation is similar also in a range close to the ground potential GND. That is, by temporarily pulling the potential at the output section 12 of the amplifier circuit 10, namely at the output point P, down to the ground potential GND, it becomes possible for the N-channel transistor M1 to operate. Since the transistor M1 has no ability to draw in current but does have the ability to expel current, this becomes possible. Thus, drive becomes possible over the full range from the supply voltage $V_{DD}$ to the ground potential GND. FIGS. 3 and 4 illustrate these circumstances.

The operation set forth above will be described in detail with reference to FIGS. 5 and 6.

The description will be rendered by being divided into a case where precharging is unnecessary and a case where it is necessary. Whether or not precharging is necessary is determined by the higher-order n-bit determination circuit 22.

(When Precharging is Unnecessary)

Figures 3A, 3B:
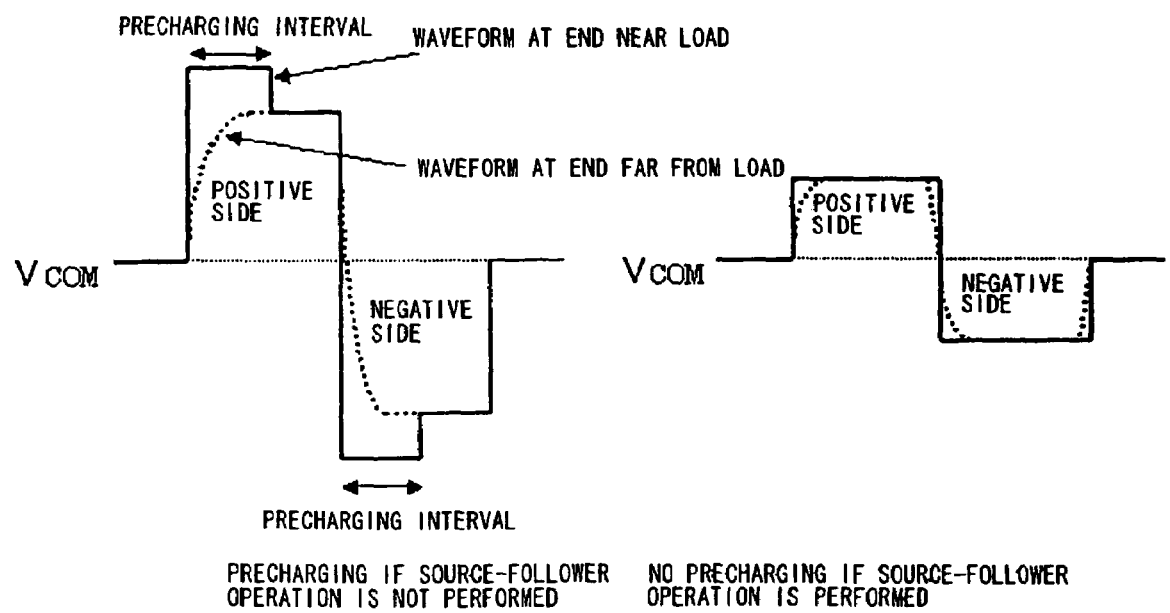
FIGS. 3a and 3b are waveform diagrams illustrating examples of an output waveform of the LCD driver circuit according to the first embodiment.

In a case where precharging is unnecessary, as shown in FIG. 5, the switch S1 is turned on (closed) at all times in order to make it possible to output the output voltage Vout, and the switches S4 and S5 are turned OFF (opened) at all times so that precharging will not be carried out. Further, since the LCD driving amplifier circuit 10 performs class-B push-pull amplification, it is preferred that an output idling current be passed by turning on switch S2 or S3 selectively in order to stabilize the gate potential of transistors M1, M2 in the source-follower circuit block when the output current has become nil. This will be described with reference to the timing chart of FIG. 5. In the interval in which the polarity of the input voltage Vin is positive (times $t_1$ to $t_2$) (i.e., one horizontal synchronization interval=1 H), switch S2 is turned ON, switch S3 is turned OFF and switch S1 is turned ON, whereby a constant current from the constant-current source CI1 is made to flow toward the output terminal Tout. In the interval in which the polarity of the input voltage Vin is negative (time $t_2$ to $t_3$) (i.e., the next horizontal synchronization interval), switch S2 is turned OFF, switch S3 is turned ON and switch S1 is turned ON, whereby the constant current from the constant-current source CI1 is drawn in from the output terminal Tout. The waveform of the output signal voltage Vout in this case is as shown in FIG. 3b. As indicated in FIG. 3b, the solid line is the waveform at the end near the load, namely the waveform at the end near the load 60, and the dashed line is the waveform at the end far from the load, namely the waveform at the end far from the load 60.

It should be noted that even in a case where precharging is unnecessary, precharging may be performed in order to hasten the writing of data to the liquid crystal panel. $V_{DD2}$ in FIG. 5 indicates the amplitude of the control voltage for controlling switches.

(When Precharging is Necessary)

In a case where precharging is necessary, the LCD driving amplifier circuit 10 performs class-B push-pull amplification in a manner similar to that when precharging is unnecessary and therefore it is necessary to pass an output idling current by turning on switch S2 or S3 selectively in order to stabilize the gate potential of transistors M1, M2 in the source-follower circuit block when the output current has become nil. However, in order to perform precharging while limiting time, it is necessary to adapt the control method in a case where precharging is required.

According to this embodiment, it is so arranged that precharging is performed using the initial part of the time period of each horizontal scanning interval in order to carry out precharging while limiting time. This will be described with reference to the timing chart of FIG. 6. In the initial part of the interval in which the polarity of the input voltage Vin is positive (time $t_{11}$ to $t_{12}$) (i.e., the initial part of one horizontal synchronization interval), switch S1 is turned OFF to sever the output terminal Tout from the source-follower circuit block (output point P), and switch S4 is turned ON to apply the supply voltage $V_{DD}$ to the output terminal Tout, whereby the output terminal Tout is precharged. As a result, the supply voltage $V_{DD}$ is applied directly to the output terminal Tout and therefore the output voltage Vout is pulled up to $V_{DD}$. Thereafter, at time $t_{12}$, switch S4 is turned OFF to halt precharging and switch S1 is turned ON to connect the output terminal Tout to the source-follower circuit block (output point P), whereupon the output voltage of the source-follower circuit block (the signal voltage at output point P) appears at the output terminal Tout. As a result, the output voltage of this block is output to output terminal Tout (i.e., is returned to the desired voltage). This restoration operation is carried out by the P-channel transistor M2 having the source-follower configuration and continues over the remaining part (time $t_{12}$ to $t_1$) of the interval during which the polarity of the input signal voltage Vin is positive.

During the time that the polarity of the input signal voltage Vin is positive (time $t_{11}$ to $t_{13}$), switch S2 is held in the ON state (switch S3 is held in the OFF state). This is to bias the transistor M2 by the constant-current source CI1 so that the output-voltage restoration operation mentioned above will be performed satisfactorily.

In the initial precharging interval during which the polarity of the input voltage Vin is negative (time $t_{13}$ to $t_{14}$) (i.e., the next horizontal synchronization interval), switch S1 is turned OFF to sever the output terminal Tout from the source-follower circuit block (output point P), and switch S5 is turned ON to apply the ground potential GND to the output terminal Tout, whereby the output terminal Tout is precharged. As a result, the ground potential GND is applied directly to the output terminal Tout and therefore the output voltage Vout is pulled down to GND. Thereafter, at time $t_{14}$, switch S5 is turned OFF to halt precharging and switch S1 is turned ON to connect the output terminal Tout to the source-follower circuit block (output point P), whereupon the output voltage of the source-follower circuit block (the signal voltage at output point P) appears at the output terminal Tout. As a result, the output voltage of this block is output to output terminal Tout (i.e., is returned to the desired voltage). This restoration operation is carried out by the N-channel transistor M1 having the source-follower configuration and continues over the remaining part (time $t_{14}$ to $t_{15}$) of the interval during which the polarity of the input signal voltage Vin is negative.

During the time that the polarity of the input signal voltage Vin is negative (time $t_{13}$ to $t_{15}$), switch S2 is held in the OFF state (switch S3 is held in the ON state). This is to bias the transistor M1 by the constant-current source CI2 so that the output-voltage restoration operation mentioned above will be performed satisfactorily. The waveform of the output signal voltage Vout in this case is as shown in FIG. 3a. As indicated in FIG. 3a, the solid line is the waveform at the end near the load, and the dashed line is the waveform at the end far from the load.

As will be understood from the waveform of FIG. 3a, the waveform (indicated by the solid line) at the near end, namely at a location near the amplifier circuit 10, is such that a projection appears at the initial part of each horizontal synchronization interval. However, the final-value arrival time is shorter than in the prior art and writing can achieved at higher speed. Further, the waveform (indicated by the dashed line) at the far end, namely at a location far from the amplifier circuit 10, becomes less steep with the time constant of the data line. In this case also, however, the final-value arrival time is shortened over that of the prior art and writing at high speed is achieved.

As will be appreciated from FIG. 5, a strobe signal STB has falling edges at times $t_1$, $t_2$, $t_3$, and the polarity of switch S2 in the horizontal scanning intervals that begin at these times becomes opposite the polarity of a polarity signal POL at these time. Further, the polarity of switch S3 in the same horizontal scanning interval is the same as the polarity of the polarity signal POL at these times. The same applies also in FIG. 6.

Figure 7:
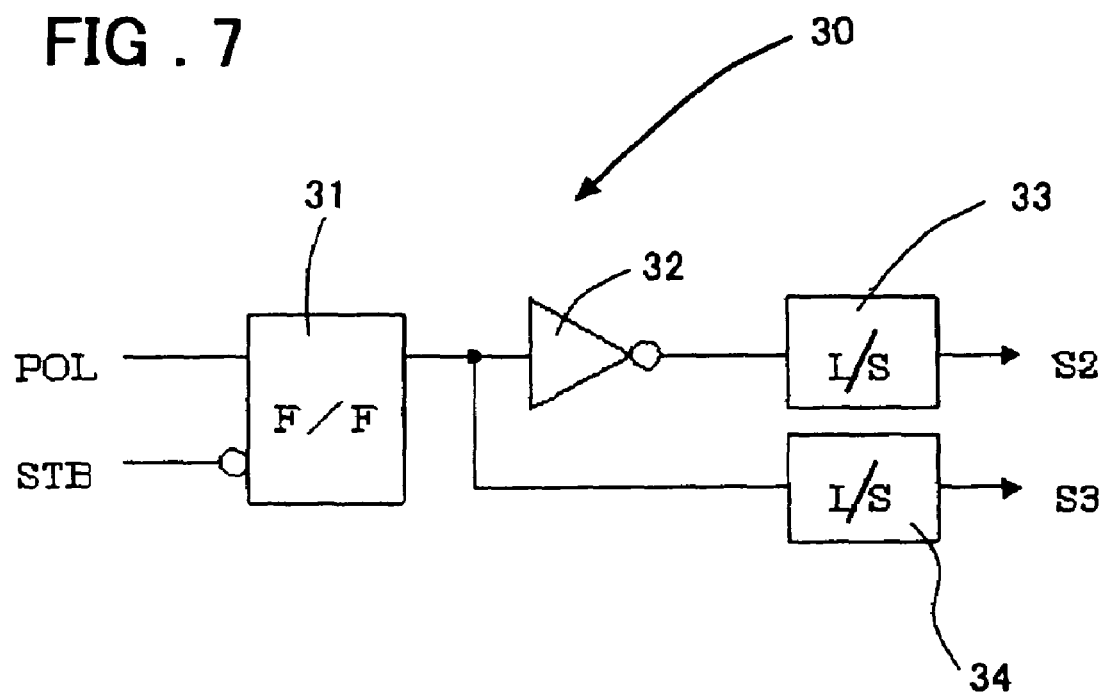
FIG. 7 is a functional block diagram illustrating an example of the structure of a switch control circuit in the LCD driver circuit according to the first embodiment.

Control of the switches S1 to S5 is performed by the switch control circuit 23 (see FIG. 2). FIG. 7 illustrates an example of a circuit arrangement for implementing control of the switches S2 and S3.

A switch control circuit 30 shown in FIG. 7 has a flip-flop (F/F) 31 for loading the polarity signal POL at the falling edge of the strobe signal STB, an inverter circuit 32 for inverting the polarity of the output of flip-flop 31, a level shifter (L/S) circuit 33 for shifting the voltage level of the output of inverter circuit 32, and a level shifter circuit 34 for shifting the voltage level at the output of the flip-flop 31. The level shifter circuits 33 and 34 are circuits for transmitting signals from low-voltage logic voltage (e.g., 3.3 V) to high voltage (e.g., 10 V). It should be evident that the operation of switches S2 and S3 conforming to the waveform diagrams of FIGS. 5 and 6 can be implemented by the switch control circuit 30.

Figure 8:
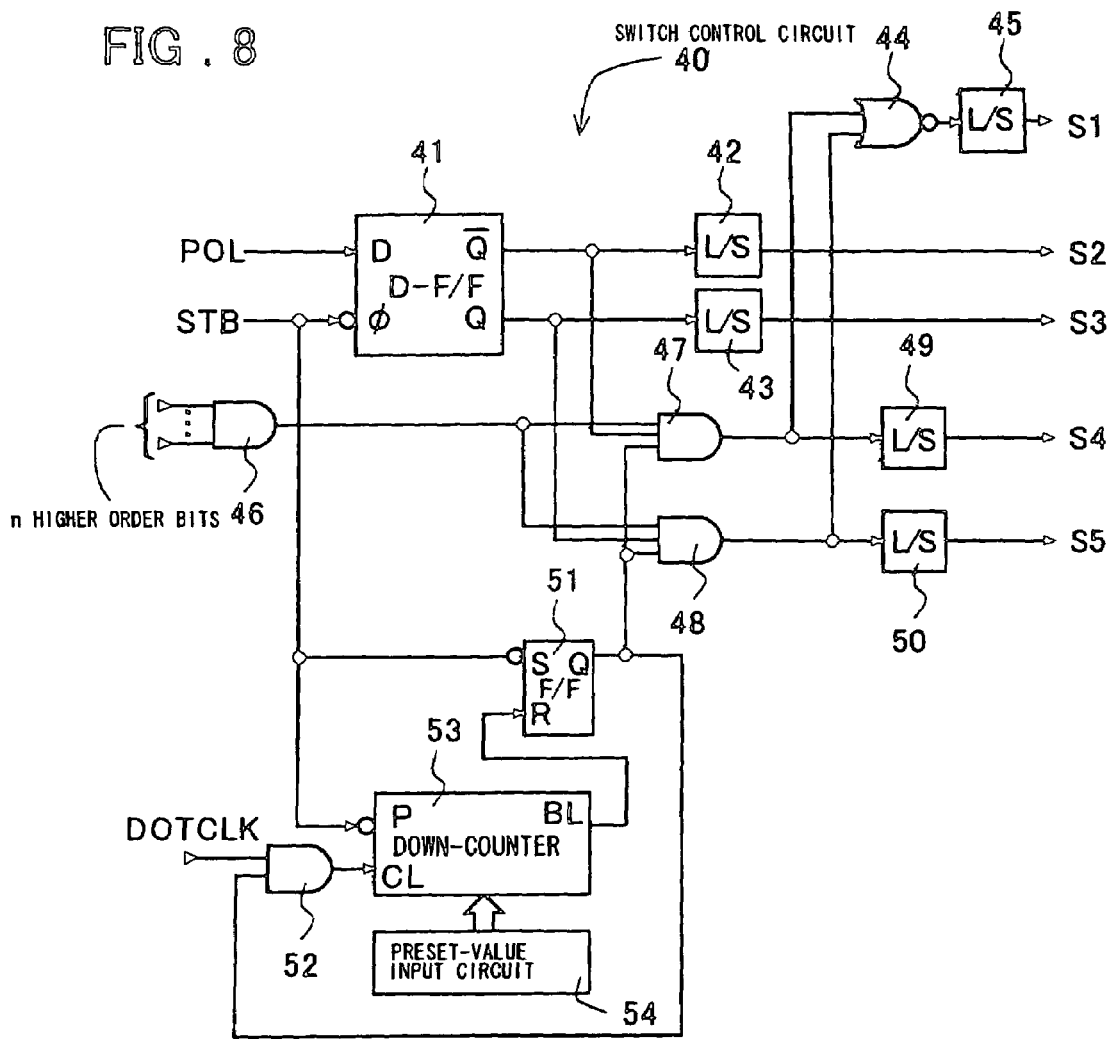
FIG. 8 is a diagram illustrating the structure of the switch control circuit for performing control to turn switches S1 to S5 ON and OFF.
Figure 9:
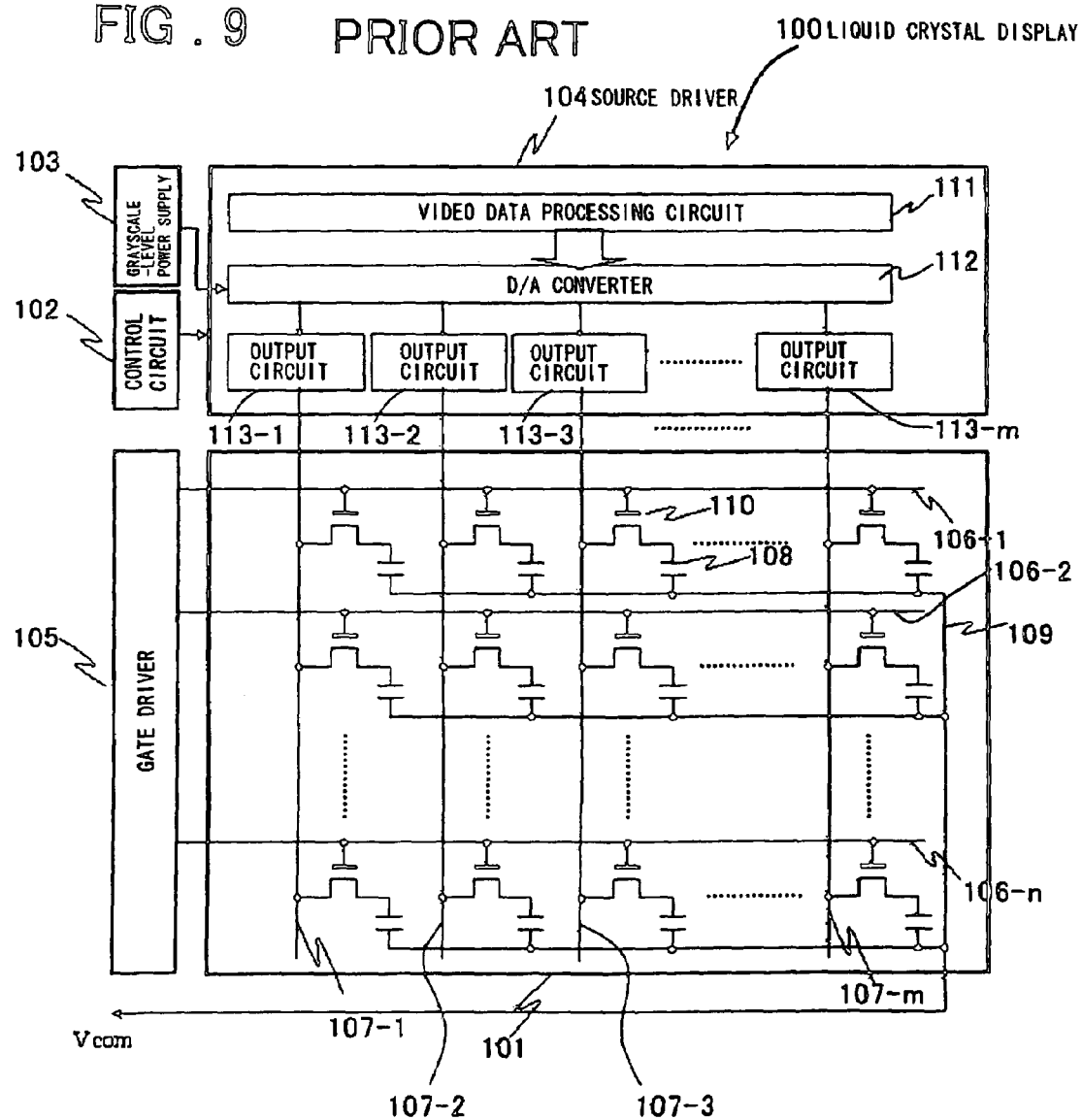
FIG. 9 is a diagram schematically illustrating the structure of a conventional liquid crystal display (Example 1) that uses single-sided drive.
Figure 10:
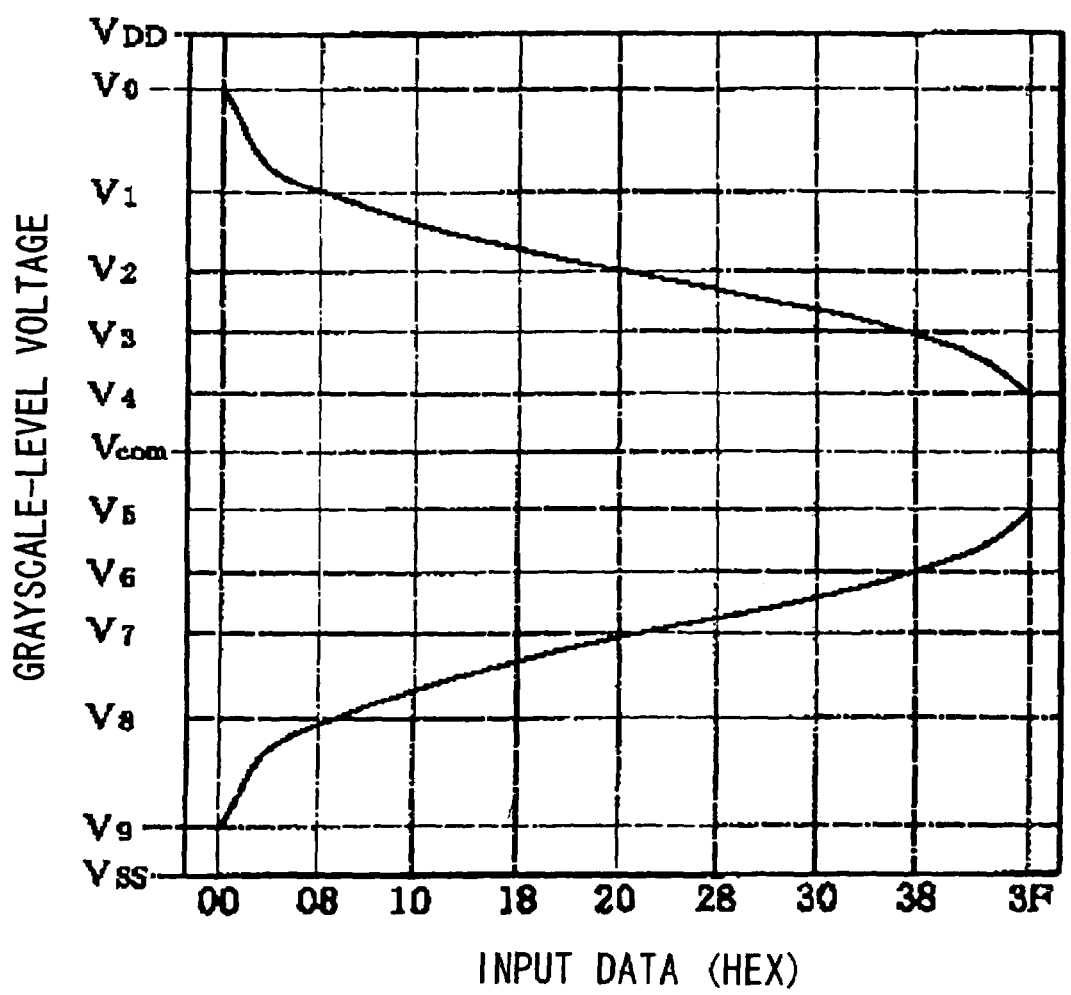
FIG. 10 is a graph illustrating the relationship between 6-bit input data and grayscale-level voltages V0 to V4 and V5 to V9.
Figure 11:
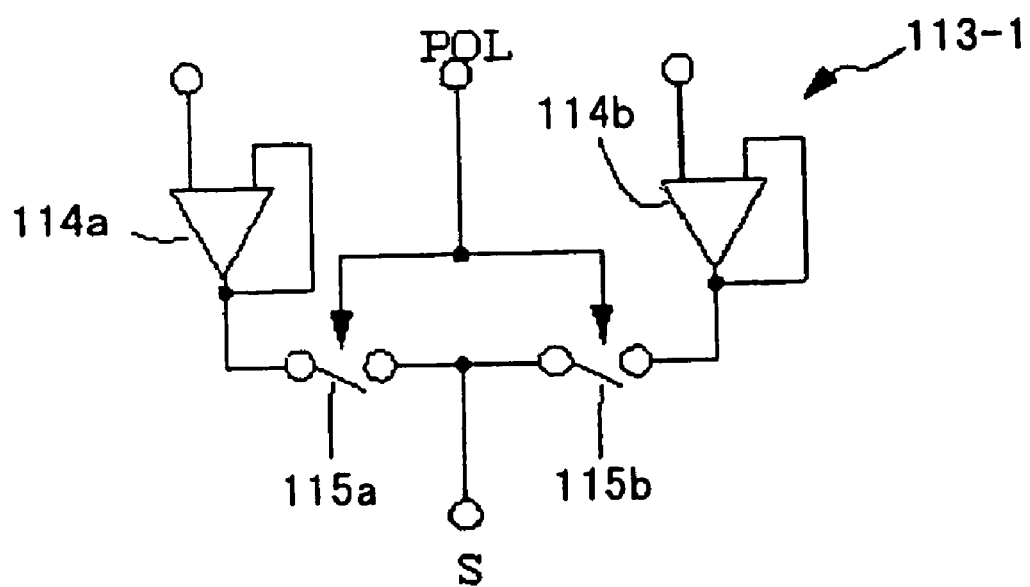
FIG. 11 is a circuit diagram illustrating the structure of an output circuit used in the conventional liquid crystal display shown in FIG. 9.
Figure 12:
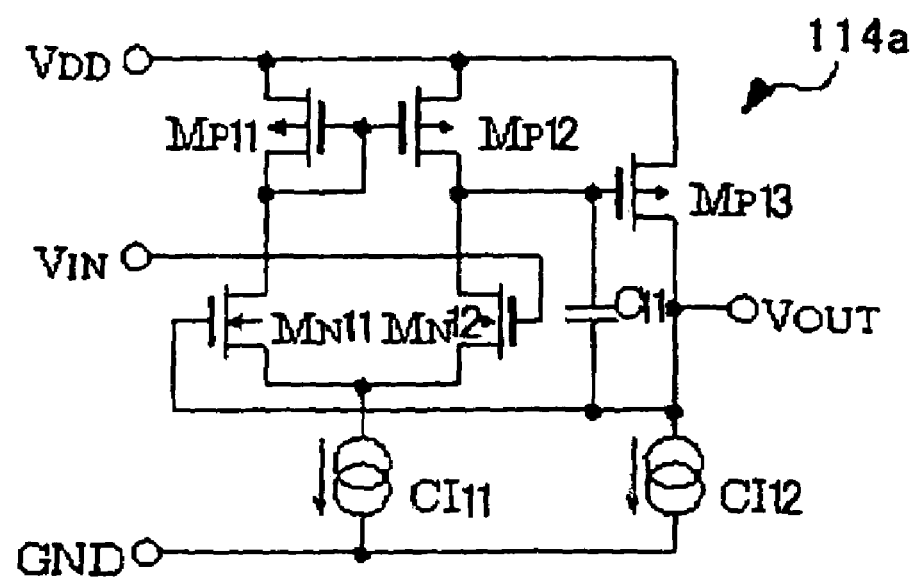
FIG. 12 is a circuit diagram illustrating an example of a voltage follower that constructs the output circuit used in the conventional liquid crystal display shown in FIG. 9.
Figure 13:
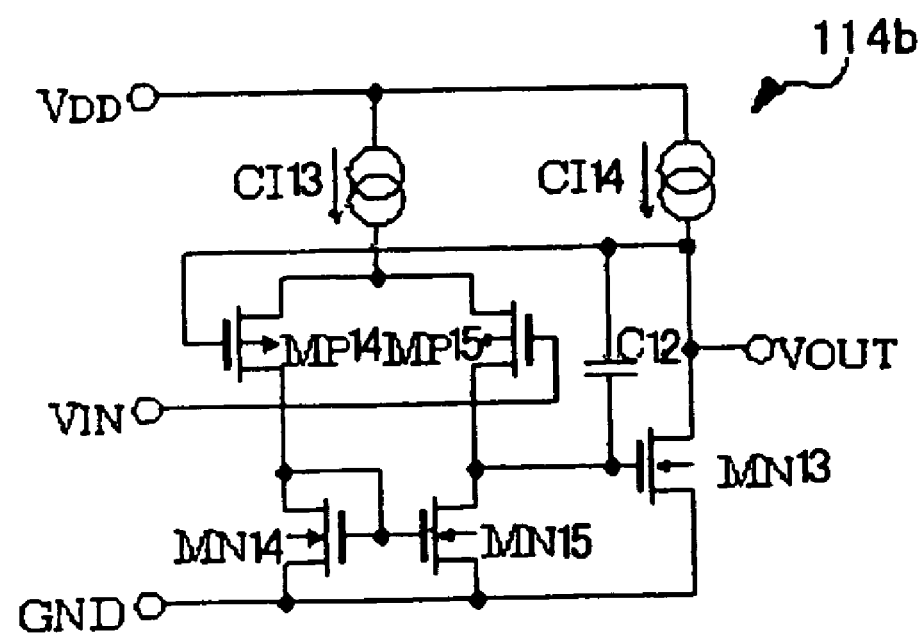
FIG. 13 is a circuit diagram illustrating an example of another voltage follower that constructs the output circuit used in the conventional liquid crystal display shown in FIG. 9.
Figure 14:
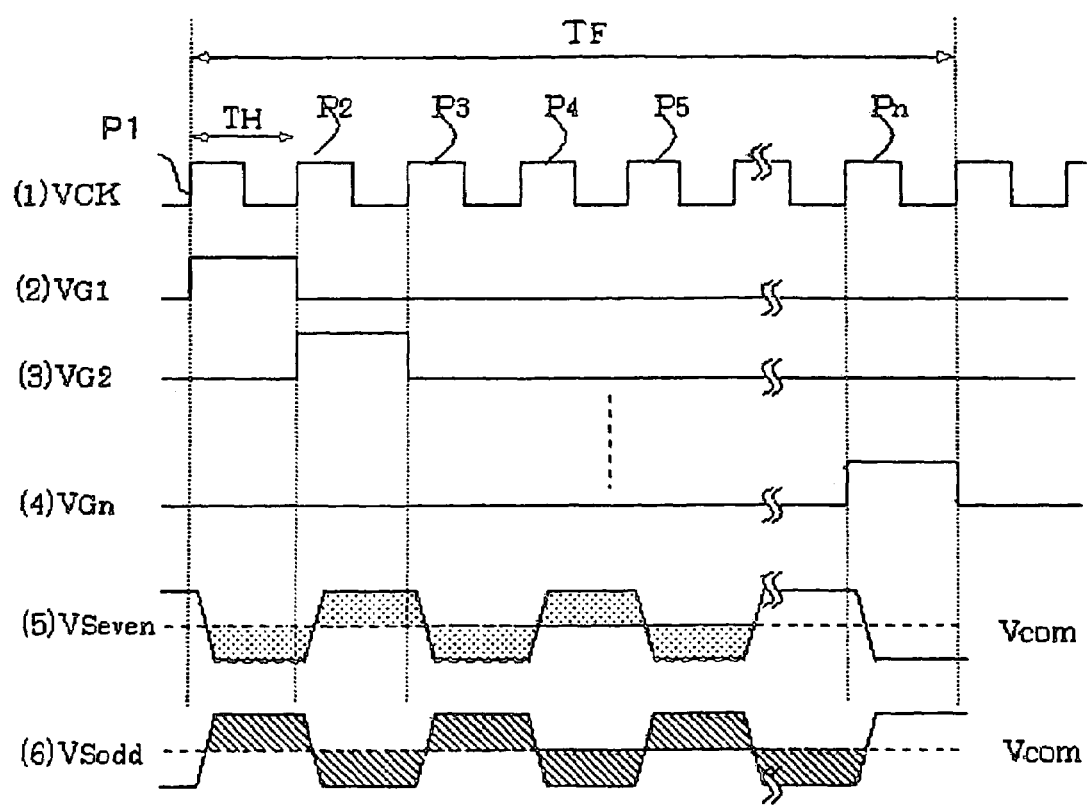
FIG. 14 is a timing chart illustrating the operation of the conventional liquid crystal display shown in FIG. 9.
Figure 15:
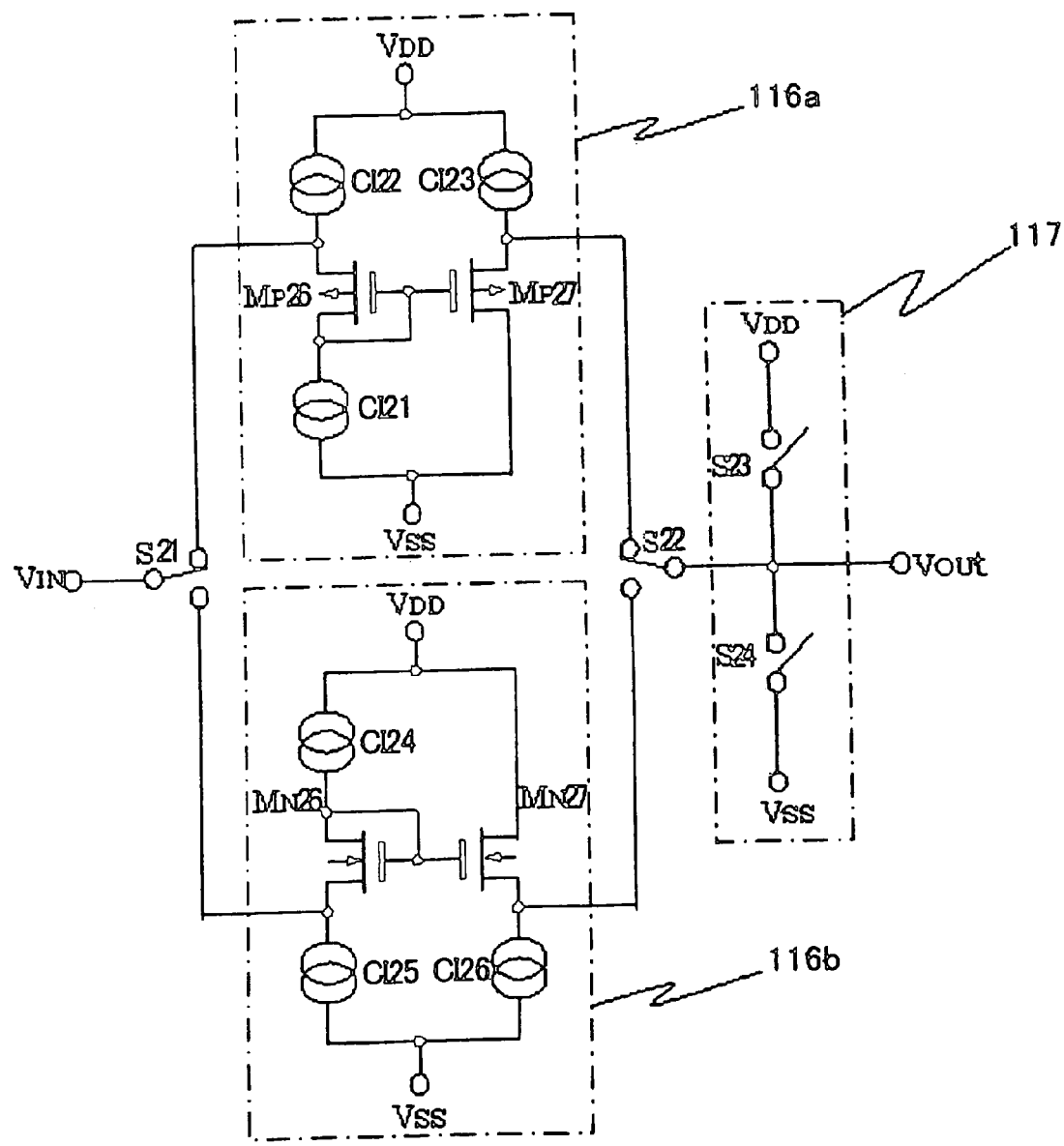
FIG. 15 is a circuit diagram illustrating another example (Example 2) of a structure that can be used for a voltage follower in FIG. 11.
Figures 16A, 16B:
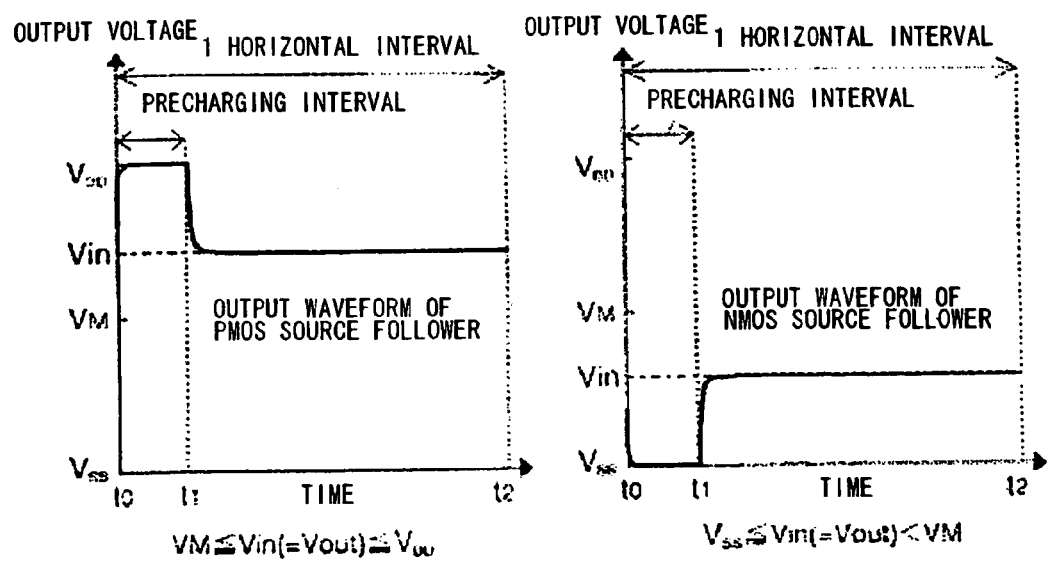
FIGS. 16A and 16B are a waveform diagram illustrating an output waveform in the voltage follower of FIG. 15.

Another example of the structure of the switch control circuit 23 (see FIG. 2) is illustrated in FIG. 8. FIG. 8 is a block diagram of a switch control circuit 40 for controlling the ON and OFF operation of switches S1 to S5. In this example, an n-input AND gate 46 is used the higher-order n-bit determination circuit 22 (see FIG. 2).

The polarity signal POL and a signal that is the inverse of the strobe signal STB are input to a data terminal D and latch terminal ϕ, respectively, of a D-type flip-flop 41. Output signals from two data terminals Q and $\overline{Q}$ of the D-type flip-flop 41 are delivered via level registers 43 and 42, respectively, and become control signals for switches S3 and S2, respectively. With reference to FIG. 5, the D-type flip-flop 41 holds the logic state (L) of the polarity signal POL, which prevails at the falling edge (time $t_1$) of the strobe signal STB, until the next falling edge (time $t_2$) of the strobe signal STB, then holds the logic state (H) of the polarity signal POL, which prevails at the falling edge (time $t_2$) of the strobe signal STB, until the next falling edge (time $t_3$) of the strobe signal STB. Accordingly, the waveforms of the control signals of switches S2 and S3 become as shown in FIG. 5.

(Operation is Similar Also in FIG. 6.)

The strobe signal STB enters a set terminal S of a flip-flop 51 and a data terminal P of a down-counter 53. An output signal of a 2-input AND gate 52 is input to a clock terminal CL of the down-counter 53. An output signal from an output terminal BL of the down-counter 53 is input to a reset terminal R of the flip-flop 51. An output signal from the output terminal Q of the flip-flop 51 enters one input terminal of the 2-input AND gate 52 and 3-input AND gates 47 and 48. A dot clock enters the other input terminal of the 2-input AND gate 52. The output signals from the two data terminals Q and $\overline{Q}$ of the D-type flip-flop 41 are input to other input terminals of the 3-input AND gates 48 and 47, respectively. Output signals from the output terminals of the 3-input AND gates 47 and 48 are delivered via level registers 49 and 50 and become control signals for the switches S4 and S5, respectively.

A preset-value input circuit 54 is used to input a preset value to the down-counter 53. In sync with the input signal to its clock input terminal CL, the down-counter 53 counts down the input signal to its data input terminal P from the preset value to zero and successively outputs signals the logical states of which conform to the value of the count. The preset value is set in such a manner that a desired precharging interval will be obtained in a case where the higher order n bits of the digital input signal are all "1"s.

With reference to FIG. 6, the output signals from the data terminals Q and $\overline{Q}$ of the D-type flip-flop 41 have waveforms the same as those of the control signals of switches S2 and S3, respectively. In other words, the output signal from the data terminal Q is at the H logic level from time $t_{11}$ to time $t_{13}$ and reverts to the L logic level from time $t_{13}$ to time $t_{15}$. The output signal from the data terminal $\overline{Q}$ is at the L logic level from time $t_{11}$ to time $t_{13}$ and rises to the H logic level from time $t_{13}$ to time $t_{15}$. On the other hand, the output signal from the output terminal Q of flip-flop 51 is held at a logic state that is the reverse of the logic state of strobe signal STB until an H-level signal enters reset terminal R from the down-counter 53. That is, the output signal is at the H logic level from time $t_{11}$ to just before time $t_{13}$ and then reverts to the L logic level until time $t_{13}$. The output signal from the output terminal of the n-input AND gate 46 attains the H level in a case where the higher order n bits of the digital input signal are all "1"s. As a result, the waveform of the control signals for switches S4 and S5 are as shown in FIG. 6.

More specifically, if the higher order n bits of the digital input signal are all "1"s and the output signal of the n-input AND gate 46 is at logical state H from time $t_{11}$ to time $t_{12}$, then the output signal from the data terminal $\overline{Q}$ of D-type flip-flop 41 is at the H level and the output signal from the output terminal Q of flip-flop 51 is at the H level because it is held at the logic state that is the reverse of the logic state of strobe signal STB until an H-level signal enters reset terminal R from the down-counter 53. Accordingly, from time $t_{11}$ to $t_{12}$, the output signal of 3-input AND gate 47 rises to the H logic level. If the higher order n bits of the digital input signal cease being all "1"s during time $t_{12}$ to $t_{13}$, the output of the 3-input AND gate 47 reverts to logical L. As a result, the waveform of the control signal of switch S4 from time $t_{11}$ to $t_{13}$ becomes as shown in FIG. 6.

From time $t_{11}$ to $t_{13}$, the output signal from the data terminal Q of D-type flip-flop 41 is held at the L logic level and therefore the output signal of the 3-input AND gate 47 is held at logical L during this time. Accordingly, the waveform of the control signal of switch S5 is as shown in FIG. 6.

The control signal of the switch S5 from time $t_{11}$ to $t_{15}$ has the waveform shown in FIG. 6 from reasons similar to those related to switch S4.

The output signals of the 3-input AND gates 47 and 48 have waveforms identical with those of the control signals of switches S4 and S5, respectively. A signal obtained by extracting the output signal of a NOR gate 44 via a level shifter 45 is the control signal for switch S1. When the logical state of the control signal of switch S4 or of switch S5 is at the H level, the control signal of switch S1 takes on the L level. Accordingly, the waveform is as shown in FIG. 6.

As described above in detail, the LCD driving amplifier circuit 10 of this embodiment is such that the N-channel transistor M1 and P-channel transistor M2 placed on the output side of the differential amplifier 11 are connected serially between two power supply terminals (which here are the power supply terminal and ground terminal) in a form in which the sources of the transistors are connected to the output point P, and the output point P is driven in push-pull fashion in response to the output signal Vina of the differential amplifier 11. On the output side of the differential amplifier 11, the transistors M1 and M2 have the source-follower arrangement, respectively. The transistors M1 and M2 drive the output point P in push-pull fashion in response to the output signal Vina of the differential amplifier 11. As a result, an output deviation ascribable to offset voltage can be reduced and the danger that image quality will decline owing to an output deviation is mitigated. Further, according to this embodiment, power consumption can be reduced because the transistors M1 and M2 perform a push-pull operation based upon class-B operation.

Furthermore, since the signal at output point P is fed back to the inverting input terminal of the differential amplifier 11, the driving capability of transistors M1 and M2 can be exploited effectively. Driving capability is enhanced as a result.

Furthermore, the higher-order n-bit determination circuit 22 examines n-number of higher bits of the digital input signal Vdin, determines whether precharging (overdrive) is necessary and sends the switch control circuit 23 a signal conforming to the result of this determination. The switch control circuit 23 controls the ON and OFF (switching)

operation of the switches S1 to S5 in accordance with this signal and therefore is capable of performing a precharging operation only for the time necessary.

Furthermore, the precharging interval is limited to the initial part of each horizontal scanning interval and precharging is applied to the output terminal Tout using switches S4 and S5, whereby the output voltage Vout that appears at the output terminal Tout is pulled up to the supply voltage $V_{DD}$ or down to the ground potential GND. The result is that the capacitive load 60, such as an LCD, can be driven at high speed.

It should be noted that the present invention is applicable even in so-called "2H" drive in which the polarity of a data signal is reversed every two horizontal synchronization intervals. Further, if it is so arranged that precharging is carried out at all times irrespective of the digital input signal Vdin, a so-called overdrive function can be implemented by the present invention. An advantage gained as a result is that write time can be shortened. It is preferred in this case that the overdrive interval be optimized in dependence upon the output voltage Vout.

(Variant)

The above-described embodiment illustrates an example in which the present invention is put in concrete form. Accordingly, it goes without saying that the present invention is not limited to this embodiment and can be modified in various ways without departing from the gist of the invention. For example, in the embodiment described above, the higher-order n-bit determination circuit 22 determines whether or not precharging is necessary by investigating the n-number of higher order bits of the digital input signal Vdin. However, other determination methods can also be employed so long as it is possible to determine whether or not precharging is necessary.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A driver circuit comprising:
   an amplifier circuit for receiving an input signal;
   first and second transistors of mutually different conductivity types, which are connected serially between two power supply terminals in a form in which sources of said transistors are connected to an output point, for push-pull driving the output point in response to an output signal from said amplifier circuit;
   a first switch provided in parallel with said first transistor between one of the two power supply terminals and the output point;
   a second switch provided in parallel with said second transistor between the other of the two power supply terminals and the output point; and
   a third switch provided in a path that connects an output terminal of said driver circuit and the output point, said third switch being controlled so as to open the path when precharging of the output point is performed and close the path when precharging is not performed;
   wherein a signal at the output point is fed back to said amplifier circuit.

2. The driver circuit according to claim 1, wherein said first and second transistors are driven in push-pull fashion based upon class-B operation.

3. The driver circuit according to claim 1, further comprising:
   a fourth switch and a first constant-current source connected serially to each other are provided in parallel with said first transistor between one of the two power supply terminals and the output point, and a fifth switch and a second constant-current source connected serially to each other are provided in parallel with said second transistor between the other of the two power supply terminals and the output point;
   said fourth switch being controlled so as to be turned ON and OFF substantially in sync with ON and OFF operation of the first transistor; and
   said fifth switch being controlled so as to be turned ON and OFF substantially in sync with ON and OFF operation of said second transistor.

4. The driver circuit according to claim 3, wherein said fourth switch and said first constant-current source as well as said fifth switch and said second constant-current source are used to pass an output idling current.

5. A driver circuits, comprising:
   an amplifier circuit for receiving an input signal;
   first and second transistors of mutually different conductivity types, which are connected serially between two power supply terminals in a form in which sources of said transistors are connected to an output point, for push-pull driving the output point in response to an output signal from said amplifier circuit; and
   a determination circuit for investigating the input signal and determining whether or not precharging is necessary;
   wherein a signal at the output point is fed back to said amplifier circuit.

6. The driver circuit according to claim 5, wherein said determination circuit discriminates n-number (where n is a positive integer) of higher order bits of the input signal to thereby determine whether or not precharging is necessary.

7. The driver circuit according to claim 6, wherein said determination circuit comprises an n-input AND gate.

8. A driver circuit comprising:
   a first power source line;
   a second power source line;
   an amplifier having a first input node, a second input node and an output node;
   a first current source coupled between said first power source line and said output node;
   a first transistor coupled between said first power source line and said first input node having a control gate coupled to said output node;
   a second transistor coupled between said second power source line and said first input node having a control gate coupled to said output node;
   a second current source and a first switch in series coupled between said first power source line and said first input node;
   a third current source and a second switch in series coupled between said second power source line and said first input node; and
   a third switch coupled between said first input node and an output terminal of said driver circuit.

9. The driver circuit according to claim 8 further comprising:
a fourth switch coupled between said first power source line and said output terminal; and
a fifth switch coupled between said second power source line and said output terminal.

10. The driver circuit according to claim 8, further comprising:
a first switch provided in parallel with said first transistor between one of the two power supply terminals and the output point; and
a second switch provided in parallel with said second transistor between the other of the two power supply terminals and the output point.

11. The driver circuit according to claim 8, further comprising:
a third switch provided in a path that connects an output terminal of said driver circuit and the output point, said third switch being controlled so as to open the path when precharging of the output point is performed and close the path when precharging is not performed.

* * * * *